United States Patent
Krishnamurthy

(10) Patent No.: US 8,566,686 B2
(45) Date of Patent: Oct. 22, 2013

(54) SYSTEM AND METHOD FOR OPTIMIZING READ-MODIFY-WRITE OPERATIONS IN A RAID 6 VOLUME

(75) Inventor: Naveen Krishnamurthy, Bangalore (IN)

(73) Assignee: LSI Corporation, San Jose, CA (US)

( * ) Notice: Subject to any disclaimer, the term of this patent is extended or adjusted under 35 U.S.C. 154(b) by 201 days.

(21) Appl. No.: 13/107,473

(22) Filed: May 13, 2011

(65) Prior Publication Data
US 2012/0290905 A1    Nov. 15, 2012

(51) Int. Cl.
*H03M 13/00*    (2006.01)
*G06F 11/00*    (2006.01)

(52) U.S. Cl.
USPC ............. 714/800; 714/766; 714/6.24; 714/52

(58) Field of Classification Search
USPC ......... 714/799–801, 805, 746, 757, 763–764, 714/769, 773, 766, 770, 704, 819, 823, 52, 714/6
See application file for complete search history.

(56) References Cited

U.S. PATENT DOCUMENTS

| | | | |
|---|---|---|---|
| 5,856,989 A * | 1/1999 | Oldfield et al. ............... | 714/801 |
| 8,209,587 B1 * | 6/2012 | Taylor et al. .................. | 714/770 |
| 2006/0075290 A1 | 4/2006 | Hartline et al. | |
| 2009/0077432 A1 * | 3/2009 | Nakamura et al. ............ | 714/704 |

* cited by examiner

*Primary Examiner* — Christine Tu
(74) *Attorney, Agent, or Firm* — Suiter Swantz pc llo

(57) ABSTRACT

A method is disclosed for updating parity information in a RAID 6 system wherein only one parity block is read during each write operation. Both parity blocks may be updated from the new data, the data being overwritten and either of the old blocks of parity information. A method for load balancing in a RAID 6 system using this method is also disclosed.

18 Claims, 5 Drawing Sheets

SYSTEM AND METHOD FOR OPTIMIZING READ-MODIFY-WRITE OPERATIONS IN A RAID 6 VOLUME

FIELD OF THE INVENTION

The present invention is directed generally toward data storage and more particularly to a method for maintaining parity information in a RAID 6 system.

BACKGROUND OF THE INVENTION

RAID 6 storage systems store data across multiple disks in data blocks along with two independent blocks of parity information. Parity information allows the system to recover the data blocks even if two disks in the system fail. Parity information is mathematically derived from the data stored on each disk. Parity information in one parity block, is usually derived by performing an exclusive disjunction operation (commonly known as an XOR operation) on the data blocks. Parity information in the other parity block is usually derived by a Galois field operation.

To accurately maintain both parity blocks, parity information must be updated each time new data is written to one of the disks. RAID 6 storage systems maintain parity information during a write operation by reading both parity blocks, then generating new parity information for each parity block based on the new data, the old data and old parity information from that parity block. The system may then overwrite the old data and old parity information.

Reading both blocks of parity information each time new data is written imposes significant stress on the system leading to slower access speeds and increased disk failures.

Consequently, it would be advantageous if a method existed to update parity information in a RAID 6 system without reading both blocks of parity information.

SUMMARY OF THE INVENTION

Accordingly, the present invention is directed to a novel method and apparatus for updating parity information in a RAID 6 system without reading both blocks of parity information.

During a write operation, a RAID 6 storage system using the present invention would read the data block being overwritten and one parity block. The system would then generate new parity data based on the new data, the data being overwritten, and the old parity information. The system would then overwrite the old data with the new data and each old parity block with newly generated parity information.

The RAID 6 storage system may also track the number of read operations for each parity block. Knowing how many times each parity block has been accessed, the system may load balance parity read operations between the two parity blocks by alternating which parity block the system reads for each successive write operation.

It is to be understood that both the foregoing general description and the following detailed description are exemplary and explanatory only and are not restrictive of the invention claimed. The accompanying drawings, which are incorporated in and constitute a part of the specification, illustrate an embodiment of the invention and together with the general description, serve to explain the principles.

BRIEF DESCRIPTION OF THE DRAWINGS

The numerous objects and advantages of the present invention may be better understood by those skilled in the art by reference to the accompanying figures in which.

DETAILED DESCRIPTION OF THE INVENTION

Reference will now be made in detail to the subject matter disclosed, which is illustrated in the accompanying drawings. The scope of the invention is limited only by the claims; numerous alternatives, modifications and equivalents are encompassed. For the purpose of clarity, technical material that is known in the technical fields related to the embodiments has not been described in detail to avoid unnecessarily obscuring the description.

Figure 1:
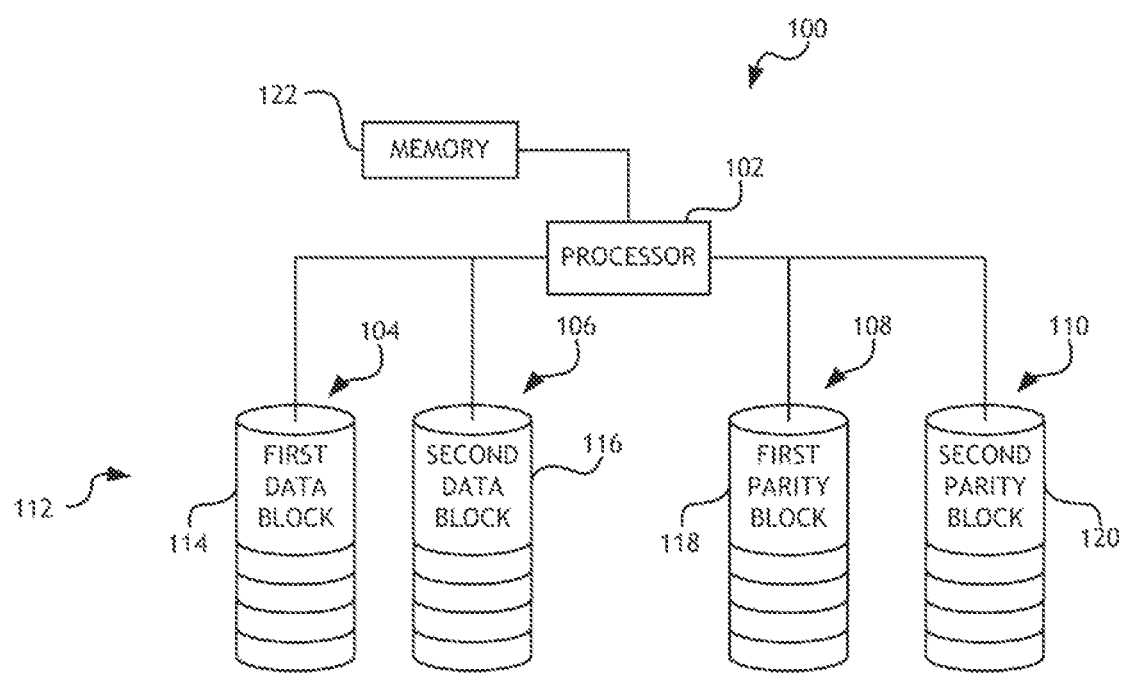
FIG. 1 shows a block diagram of a data storage system suitable for implementing embodiments of the present invention.

Referring to FIG. 1, in a RAID 6 storage system 100 each disk 104, 106, 108 and 110 is divided into a plurality of blocks of uniform size. Blocks from each disk are organized into logical "stripes." One "stripe" 112 comprises a single block from each disk; two of these blocks are "parity" blocks 118, 120, the rest are "data" blocks 114, 116. Parity blocks 118, 120 contain information necessary to rebuild all of the data blocks 114, 116 in the stripe 112. The information in each parity block 118, 120 is derived from all of the data blocks 114, 116 in the stripe 112; the first parity block 118 is derived by a processor 102 executing firmware stored in memory 122 to perform an exclusive disjunction operation on each data block 114, 116. The second parity block 120 is derived by the processor 102 executing firmware stored in memory 122 to perform an exclusive disjunction operation on each data block 114, 116 after the data block 114, 116 has a Galois field operation applied. Because each parity block 118, 120 is derived by a different process, a RAID 6 storage system 100 can recover all of the data stored on the system by mathematical operations, even if two disks fail.

Figure 2:
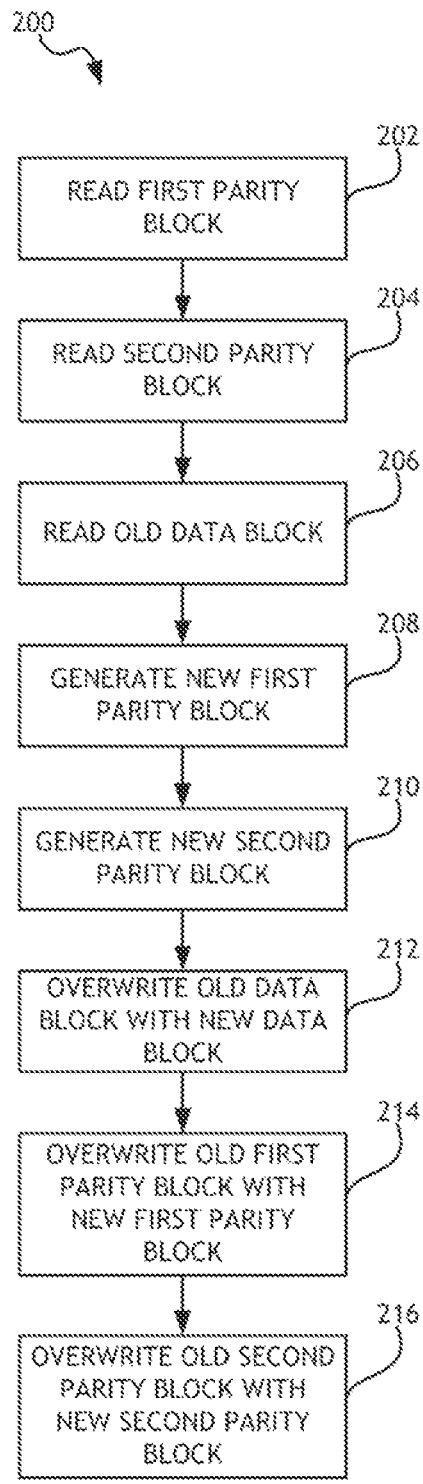
FIG. 2 shows a flowchart of an existing method for updating parity information in a data storage system having two sets of parity information.

Referring to FIG. 2, a method 200 for maintaining RAID 6 parity information is shown. Whenever a data block 114, 116 is overwritten, the RAID 6 system 100 reads 202 the first parity block 118, reads 204 the second parity block 120 and reads 206 the data block 114 or 116 being overwritten. The system 100 then generates 208 new parity information for the first parity block 118 by performing an exclusive disjunction operation on the old data, the new data and the old first parity information. The system then generates 210 new parity information for the second parity block 120 by performing an exclusive disjunction operation on the old data, the new data and the old second parity information. The system may then overwrite 212 the old data block 114, 116 with the new data, overwrite 214 the first parity block 118 with new parity information, and overwrite 216 the second parity block 120 with new parity information.

The method 200 for maintaining parity information requires three read operations; the system 100 must read the old data block 114, 116, the first parity block 118 and the second parity block 120. The present invention provides a method for maintaining parity information by reading only one parity block 118, 120.

Figure 3:
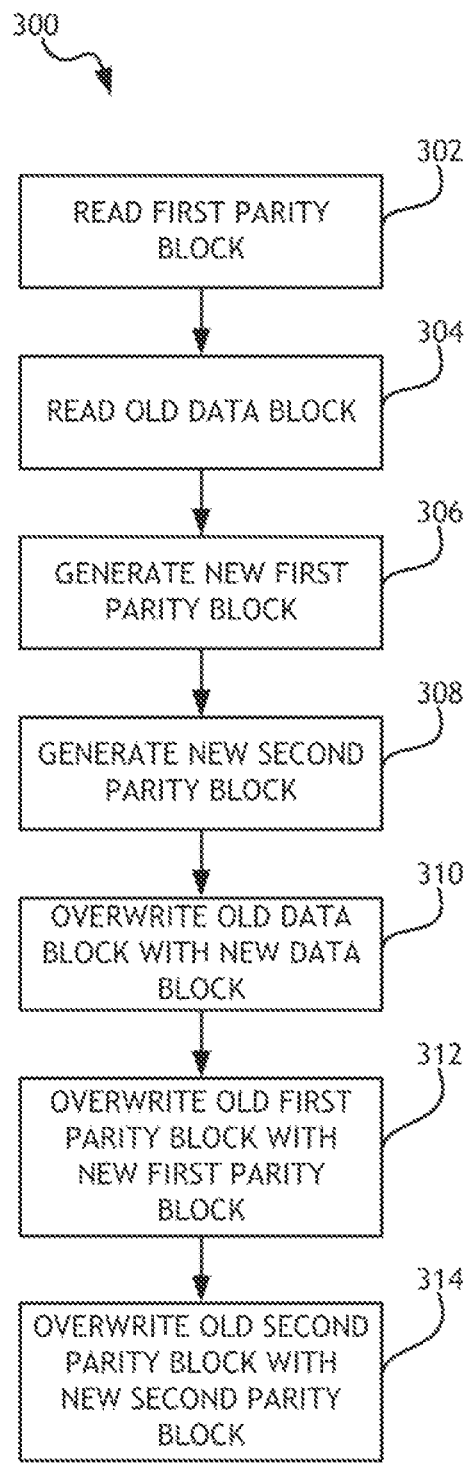
FIG. 3 shows a flowchart of a method for updating parity information in a data storage system having two independent sets of parity information.

Referring to FIG. 3, one embodiment of the present invention is a method 300 for maintaining RAID 6 parity information reading only the parity information from the first parity block 118. Whenever a data block 114, 116 is overwritten, the RAID 6 system 100 may read 302 the first parity block 118 and may read 304 the data block 114, 116 being overwritten. The system 100 may then generate 306 new parity information for the first parity block 118 by performing an exclusive disjunction operation on the old data, the new data and the old parity information. The system may then generate 308 new parity information for the second parity block 120 by performing an exclusive disjunction operation on the old data, the new data and the old parity information. The system 100 may utilize an algorithm based on the particular Galois field operation employed to originally generate the parity information in the second parity block 120. The system may then overwrite 310 the old data block 114, 116 with the new data, overwrite 312 the first parity block 118 with new parity information, and overwrite 314 the second parity block 120 with new parity information.

Figure 4:
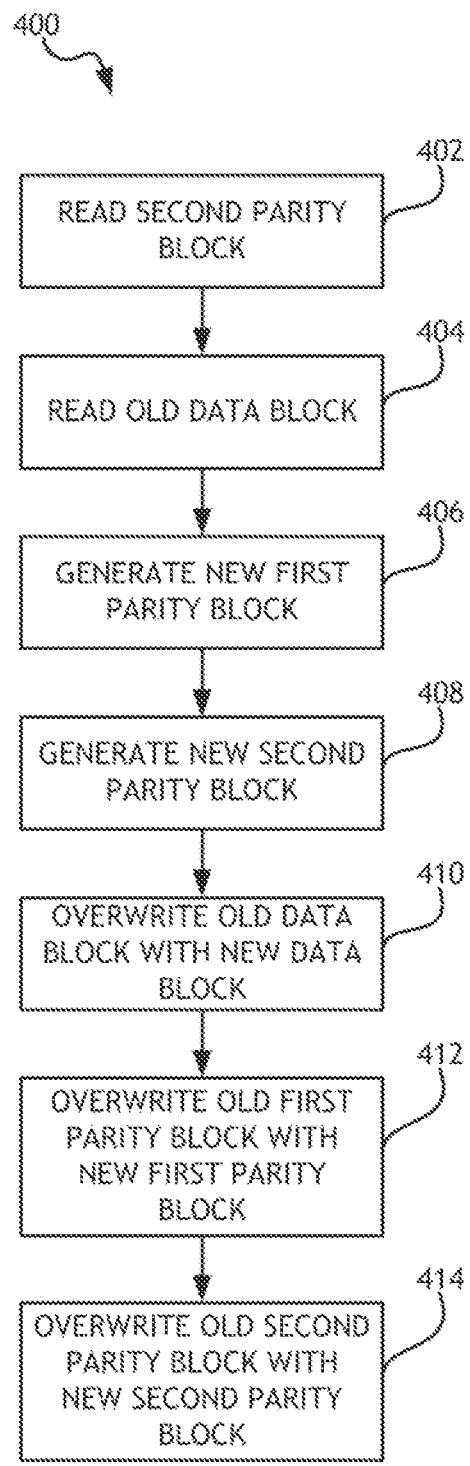
FIG. 4 shows a flowchart of another method for updating parity information in a data storage system having two independent sets of parity information.

Alternatively, referring to FIG. 4, another embodiment of the present invention is a method 300 for maintaining RAID 6 parity information reading only the parity information from the second parity block 120. Whenever a data block 114, 116 is overwritten, the RAID 6 system 100 may read 302 the second parity block 120 and may read 304 the data block 114, 116 being overwritten. The system 100 may then generate 306 new parity information for the first parity block 118 by performing an exclusive disjunction operation on the old data, the new data and the old parity information. The system 100 may utilize an algorithm based on the particular Galois field operation employed to originally generate the parity information in the first parity block 118. The system may then generate 308 new parity information for the second parity block 120 by performing an exclusive disjunction operation on the old data, the new data and the old parity information. Again, the system 100 may utilize an algorithm based on the particular Galois field operation employed to originally generate the parity information for the second parity block 120. The system may then overwrite 310 the old data block 114, 116 with the new data, overwrite 312 the first parity block 118 with new parity information, and overwrite 314 the second parity block 120 with new parity information.

Utilizing either of the embodiments set forth herein, a RAID 6 storage system 100 may update parity information during a write operation by performing only two read operations instead of three. Furthermore, the system 100 may use parity information from either the first parity block 118 or the second parity block 120, therefore the system 100 may balance the load caused by write operations by tracking the number of times each parity block 118, 120 is read and alternating which embodiment the system 100 employs to balance the toad imposed on each disk by read operations.

Figure 5:
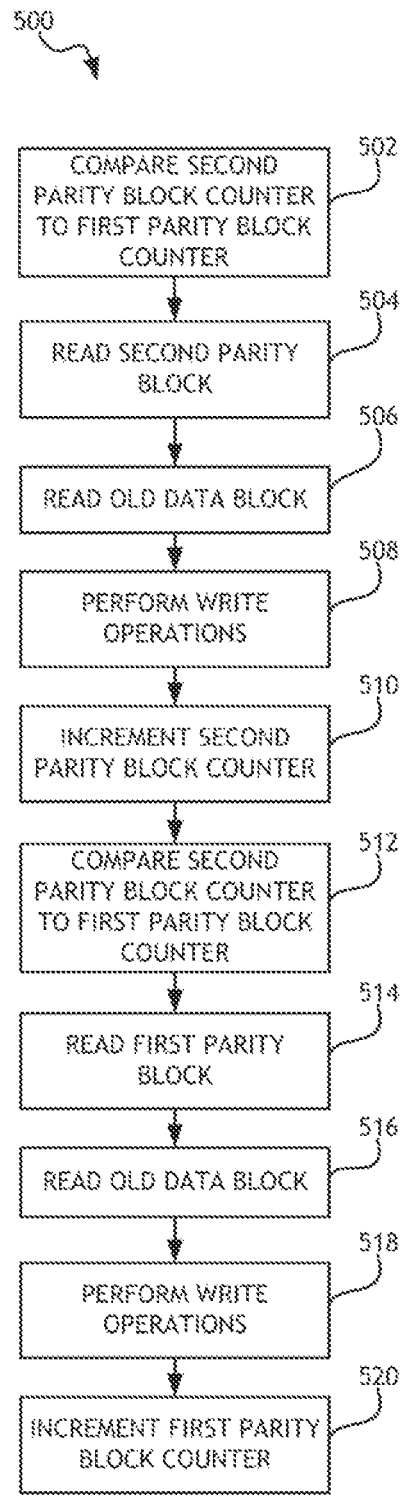
FIG. 5 shows a flowchart of a method for tracking parity read operations in a data storage system having two independent sets of parity information.

Referring to FIG. 5, another embodiment of the present invention includes a method 500 for balancing the load on each disk 108, 110 containing one of the two parity blocks 118, 120 by alternating which parity block 118, 120 the system 100 reads during successive write operations. In this embodiment, a RAID 6 storage system 100 may have a processor 102 executing firmware stared in memory 122. The firmware may include a counter associated with the first parity block 118 and a counter associated with the second parity block 120. Each counter may record the number of times each parity block 118, 120 has been read. During a write operation, the system 100 may compare 502 the first parity block 118 counter to the second parity block 120 counter, if the second parity block 120 counter is less than the first parity block 118 counter, the system 100 may read 504 parity information from the second parity block 120 and read 506 the data to be overwritten from the appropriate data block 114, 116. The system 100 may then perform 508 updates to parity information and write operations on the data block 114, 116 and parity blocks 118, 120 as set forth herein. The system 100 may then increment 510 the second parity block 120 counter. During a subsequent write operation, the system may compare 512 the first parity block 118 counter to the second parity block 120 counter, if the first parity block 118 counter is less than the second parity block 120 counter, the system 100 may read 514 parity information from the first parity block 118 and read 516 the data to be overwritten from the appropriate data block 114, 116. The system 100 may then perform 518 updates to parity information and write operations on the data block 114, 116 and parity blocks 118, 120 as set forth herein. The system 100 may then increment 520 the first parity block 120 counter. By this method, the system may track the number of read operations performed on each parity block 118, 120 and balance the load imposed by write operations between the two parity blocks 118, 120.

It is believed that the present invention and many of its attendant advantages will be understood by the foregoing description, and it will be apparent that various changes may be made in the form, construction, and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A method of updating parity information in a data storage system comprising:

reading data to be overwritten;

reading one block of existing parity information from one of a first block of existing parity information and a second block of existing parity information, wherein the first block of existing parity information and the second block of existing parity information are both associated with the data to be overwritten;

generating new parity information based on data to write, the existing parity information, and the data to be overwritten;

generating new complimentary parity information based on the data to write, the existing parity information, and the data to be overwritten;

overwriting the data to be overwritten with the data to write;

overwriting the first block of parity information with the new parity information; and overwriting the second block of parity information with the new complimentary parity information.

2. The method of claim 1, wherein generating new parity information includes a exclusive disjunction operation.

3. The method of claim 1, wherein generating new complimentary parity information includes a exclusive disjunction operation.

4. The method of claim 1, wherein generating new parity information includes a Galois field operation.

5. The method of claim 1, wherein generating new complimentary parity information includes a Galois field operation.

6. A method of load balancing read operations in a data storage system comprising:

comparing a first parity block counter to a second parity block counter,
  wherein:
    the first parity block counter is associated with a first parity block; and
    the second parity block counter is associated with a second parity block;
reading parity information from one of the first parity block and the second parity block based on the comparison of the first parity block counter and the second parity block counter;
generating new parity information for each of the first parity block and the second parity block based on the read parity information and new data;
overwriting a data block with the new data, and the first parity block and the second parity block with the new parity information; and
incrementing one of the first parity block counter and the second parity block counter based on which parity block of the first parity block and second parity block was read.

7. The method of claim 6, wherein:
the first parity block counter is less than the second parity block counter;
parity information is read from the first parity block; and
the first parity block counter is incremented.

8. The method of claim 6, wherein:
the second parity block counter is less than the first parity block counter;
parity information is read from the second parity block; and
the second parity block counter is incremented.

9. The method of claim 6, wherein generating new parity information includes a exclusive disjunction operation.

10. The method of claim 6, further comprising generating new complimentary parity information.

11. A data storage apparatus comprising:
a processor;
memory connected to the processor and containing non-transitory computer code; and
a plurality of storage disks connected to the processor,
wherein the non-transitory computer code is configured to:
  receive data to write;
  read data to be overwritten from one of the plurality of disks;
  read one block of existing parity information from one of a first block of existing parity information and a second block of existing parity information, wherein the first block of existing parity information and the second block of existing parity information are both associated with the data to be overwritten;
  generate new parity information based on the data to write, the existing parity information, and the data to be overwritten;
  generate new complimentary parity information based on the data to write, the existing parity information, and the data to be overwritten;
  overwrite the data to be overwritten with the data to write;
  overwrite the first block of parity information with the new parity information; and
  overwrite the second block of parity information with the new complimentary parity information.

12. The method of claim 11, wherein generating new parity information includes a exclusive disjunction operation.

13. The method of claim 11, wherein generating new complimentary parity information includes a exclusive disjunction operation.

14. The method of claim 11, wherein generating new parity information includes a Galois field operation.

15. The method of claim 11, wherein generating new complimentary parity information includes a Galois field operation.

16. The apparatus of claim 11, wherein the non-transitory computer code is further configured to:
compare a first parity block counter to a second parity block counter,
  wherein:
    the first parity block counter is associated with the first block of parity information; and
    the second parity block counter is associated with the second block of parity information; and
increment one of the first parity block counter and the second parity block counter based on which parity block of the first parity block and second parity block was read.

17. The method of claim 16, wherein:
the first parity block counter is less than the second parity block counter;
parity information is read from the first block of parity information; and
the first parity block counter is incremented.

18. The method of claim 16, wherein:
the second parity block counter is less than the first parity block counter;
parity information is read from the second block of parity information; and
the second parity block counter is incremented.

\* \* \* \* \*